United States Patent
Tanaka

[11] Patent Number: 5,867,509
[45] Date of Patent: Feb. 2, 1999

[54] COMMUNICATION CONTROL APPARATUS IN ATM COMMUNICATION

[75] Inventor: Koichi Tanaka, Kawasaki, Japan

[73] Assignee: Kabushiki Kaisha Toshiba, Kawasaki, Japan

[21] Appl. No.: 732,118

[22] Filed: Oct. 15, 1996

[30] Foreign Application Priority Data

Oct. 16, 1995 [JP] Japan .................................. 7-267368

[51] Int. Cl.⁶ .................................................. H03M 13/00
[52] U.S. Cl. ........................... 371/37.7; 371/53; 370/473
[58] Field of Search .............................. 371/37.1, 37.2, 371/37.6, 37.7, 42, 38.1, 47.1, 39.1, 53; 370/473, 460, 252, 351, 395, 230, 236, 253, 468, 469

[56] References Cited

U.S. PATENT DOCUMENTS

5,282,215  1/1994  Hyodo et al. .............................. 371/42
5,703,887  12/1997 Heegard et al. .......................... 371/42
5,715,259  2/1998  Lee et al. .................................. 371/42

Primary Examiner—Reba I. Elmore
Assistant Examiner—Thomas E Brown
Attorney, Agent, or Firm—Oblon, Spivak, McClelland, Maier & Neustadt, P.C.

[57] ABSTRACT

A communication control apparatus which includes a CRC circuit for performing a CRC calculation of the currently received cell data using an initial value "0" simultaneously with start of reception of data, and a CRC correction circuit for calculating a CRC correction value by performing a specific calculation of a CRC intermediate value in management data read out from a management data memory. Also included is an XOR circuit for XORing the CRC calculation result obtained by the CRC circuit and the correction value obtained by the CRC correction circuit which obtains a correct CRC intermediate value upon receiving data for one cell. The CRC calculation is started substantially simultaneously with the start of a reception of cell data, and is completed simultaneously with the end of reception, thus allowing easy read and write control of management data.

7 Claims, 9 Drawing Sheets

COMMUNICATION CONTROL APPARATUS IN ATM COMMUNICATION

BACKGROUND OF THE INVENTION

The present invention relates to a communication control apparatus for the ATM adaptation layer (AAL layer) in ATM (Asynchronous Transfer Mode) communications and, more particularly, to a communication control apparatus for performing a CRC (Cyclic Redundancy Check) calculation used in AAL type 5 (to be referred to as AAL5 hereinafter).

Figure 7:
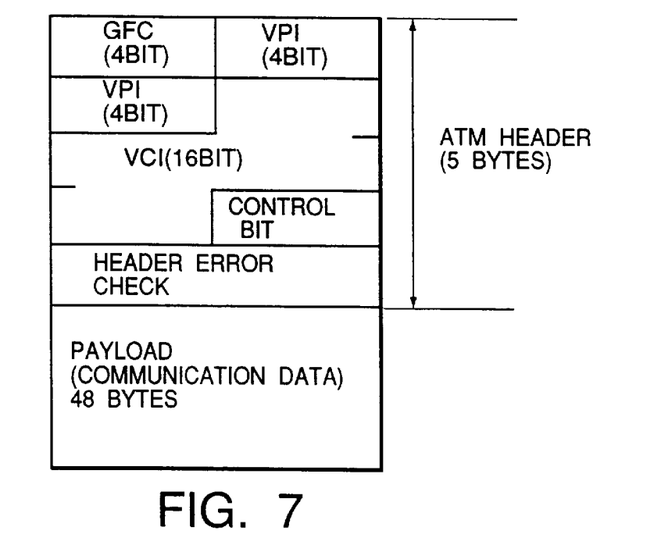
FIG. 7 is a view showing the data structure of an ATM cell.

In ATM communications, the size of communication data is defined by a 53-byte long format called an ATM cell. As shown in FIG. 7, the ATM cell consists of a 5-byte ATM header including a VPI (virtual path identifier) and a VCI (virtual channel identifier), and a 48-byte payload (communication data). The advantage of this system is that since the unit of data transfer has a fixed length, switching in a cell switch that constitutes a communication network can be implemented in hardware and, hence, a very high communication speed is viable.

Figure 8:
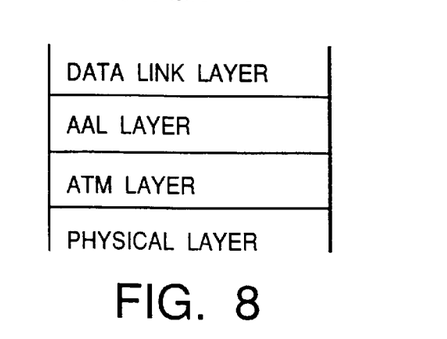
FIG. 8 is a view showing the protocol layers of ATM communications.

The protocol layers used in ATM communications have a hierarchical structure, as shown in FIG. 8. Note that an ATM layer is a layer for transferring the above-mentioned 53-byte long cell, and an AAL layer is a layer for segmentation and reassembly of variable-length communication data (called a frame) to be processed in higher layers.

Some types of AAL layers have been defined and, especially, AAL5 is important for a communication means between computers.

Figure 9:
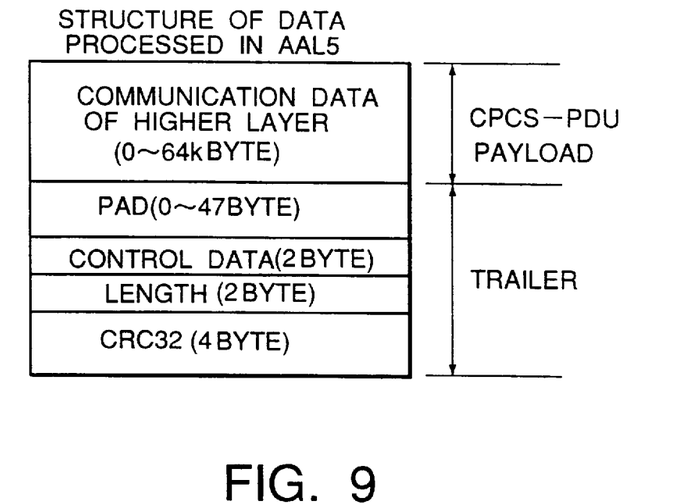
FIG. 9 is a view showing the structure of data used in an AAL5 layer.

FIG. 9 shows the structural format of a frame (CPCS-PDU) used in AAL5.

Referring to FIG. 9, 4 bytes at the end of the frame are a check code for detecting errors, and a CRC (Cyclic Redundancy Check) code is used.

In error detection, the absence of errors can be determined when mod-2 divisions using a generation polynomial (G(x)) are made from the first data of the frame, and the CRC result yields a specific value (V(x)).

$$G(x) = x^{32} + x^{26} + x^{23} + x^{22} + x^{16} + x^{12} + x^{11} + x^{10} + x^8 + \quad (1)$$
$$x^7 + x^5 + x^4 + x^2 + x + 1$$
$$V(x) = x^{31} + x^{30} + x^{26} + x^{25} + x^{24} + x^{18} + x^{15} + x^{14} + x^{12} +$$
$$x^{11} + x^{10} + x^8 + x^6 + x^5 + x^4 + x^3 + x + 1$$

Since the frame with the above-mentioned structure is divided into ATM cells to be transferred discretely, it is difficult to simultaneously perform a CRC calculation for the entire communication data. In view of this problem, in the conventional method, each time an incoming cell is received, a CRC calculation is performed and the intermediate result is held. When the subsequent arriving cell is received, a CRC calculation is restarted from the intermediate value obtained so far.

The basic principle of error detection based on the CRC calculation will be explained below.

The CRC calculation uses mod-2 cyclic codes.

An information polynomial I(x) of degree n is given by:

$$I(x) = I_0 + I_1 x^1 + I_2 x^2 + \ldots + I_{n-1} x^{n-1} \quad (2)$$

A generation polynomial G(x) of degree m is given by:

$$G(x) = G^0 + G_1 x^1 + G_2 x^2 + \ldots + G_{m-1} x^{m-1} \quad (3)$$

The information polynomial I(x) is multiplied with $x^m$, and the product is divided by G(x). Let Q(x) be the quotient, and R(x) be the remainder. Then, we have:

$$I(x)x^m = Q(x)G(x) + R(x) \quad (4)$$

Communication data A(x) is sent as:

$$A(x) = R(x) + I(x)x^m \quad (5)$$

In this case, since equation (6) below holds, A(x) can be divided by G(x) at the receiving side:

$$\begin{aligned} A(x) &= R(x) + I(x)x^m & (6) \\ &= R(x) + \{Q(x)G(x) + R(x)\} \text{ (from equation (4))} \\ &= Q(x)G(x) \end{aligned}$$

When some error has been generated in the communication data A(x), the data A(x) cannot be divided by G(x). Hence, the receiving side can detect the presence/absence of errors by determining whether or not A(x) can be divided by G(x).

In a CRC arithmetic circuit used in AAL5, it is defined that the initial value of an F/F (flip-flop) that constitutes the circuit is set to be all "1"s, and hence, CRC checking is attained by checking whether or not the calculation result is concordant with V(x) above.

The cell reassembly processing will be briefly explained below.

Figure 10:
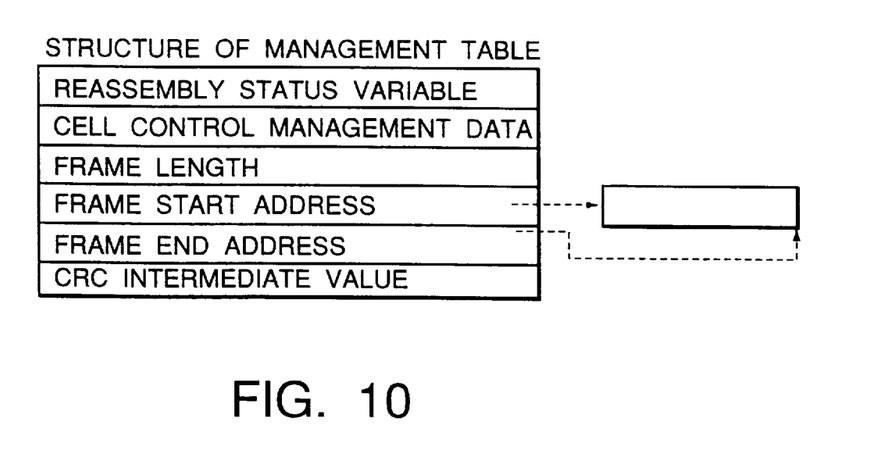
FIG. 10 is a view showing the structure of a management table.

In reassembly processing of ATM cells upon reception of these cells, a management table shown in FIG. 10 is used to support a plurality of communication lines and to manage the intermediate state during reassembly of a frame.

The management table shown in FIG. 10 stores a reassembly status variable that indicates a state before start, a state during reassembly, disposal processing, and the like, and also stores frame length data that indicates the data length of already received data associated with ATM cells received so far, the start and end addresses of received data, the intermediate value of the CRC calculation, and the like.

Figure 11:
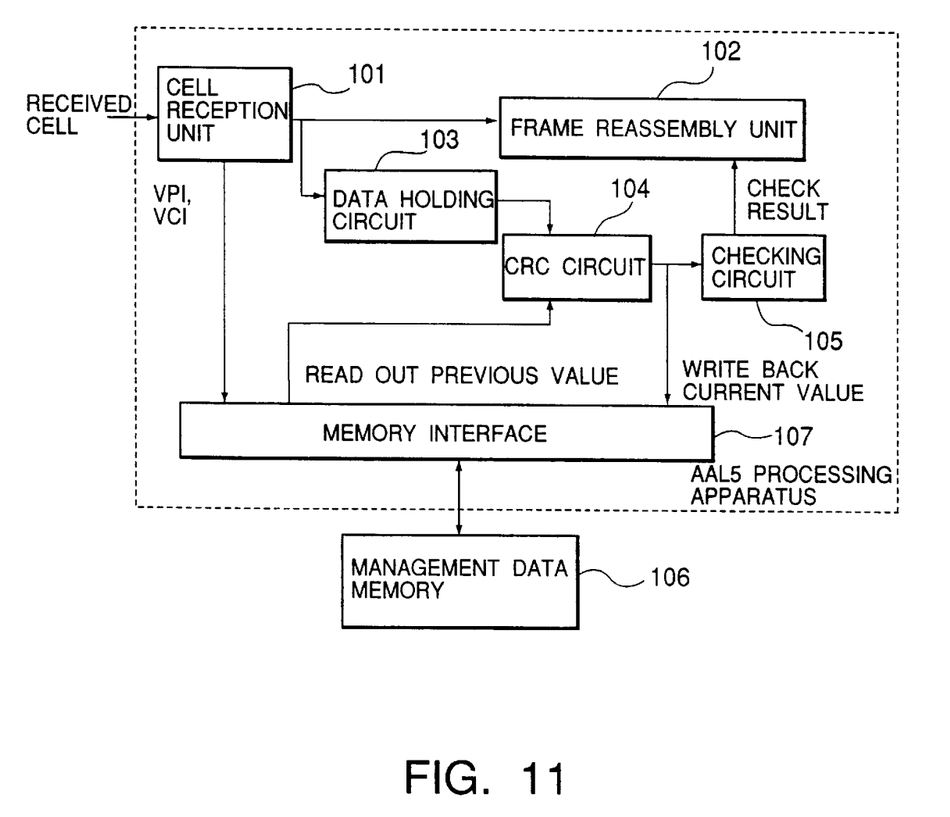
FIG. 11 is a block diagram showing the structure of a conventional AAL communication control apparatus.
Figure 12:
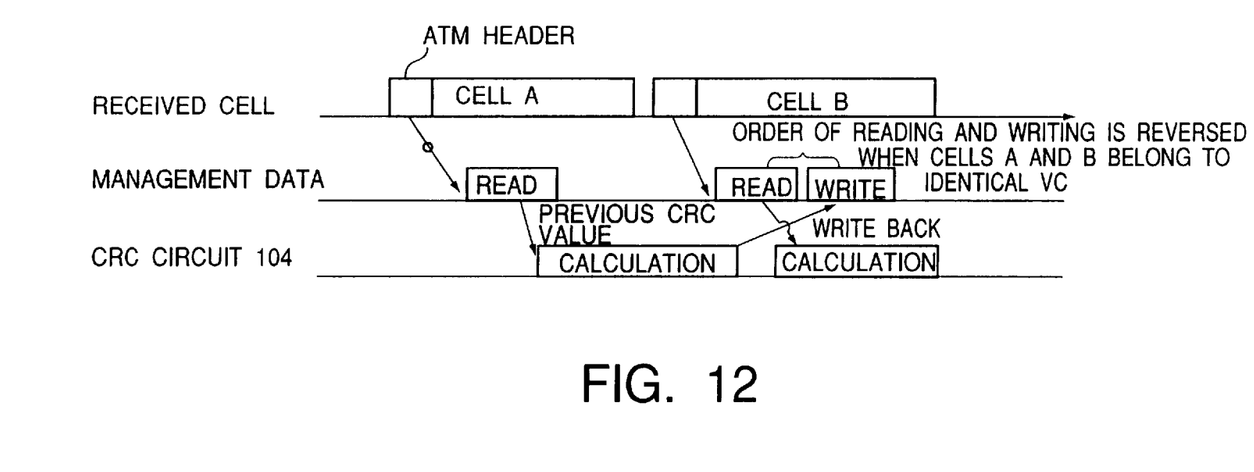
FIG. 12 is a timing chart showing the operation timings of the apparatus shown in FIG. 11.

FIG. 11 is a block diagram showing the arrangement of a conventional AAL communication control apparatus, and FIG. 12 is a timing chart showing the operation timings of the apparatus shown in FIG. 11.

Referring to FIG. 11, the communication control apparatus comprises a cell reception unit 101 for receiving cells, a frame reassembly unit 102 for reassembling a frame using cells received by the cell reception unit 101, a data holding circuit 103 for holding data of cells received by the cell reception unit 101, a CRC circuit 104 for calculating the CRC value of the currently received cell on the basis of data held in the data holding circuit 103 and the CRC intermediate value of cells received so far, a checking circuit 105 for checking the received data for any errors on the basis of the CRC value calculated by the CRC circuit 104, and a memory interface 107 for interfacing with a management data memory 106 which stores the above-mentioned management data.

In this arrangement, when an ATM cell is received by the cell reception unit 101, a VPI and VCI stored in the ATM header are supplied to the memory interface 107 to specify a management table of the corresponding VC (Virtual Channel), and the specified management data are read out from the management data memory 106 that holds VC management data.

The frame reassembly unit 102 checks the reassembly status variable, and if the reassembly status variable indicates a state before start, frame management control data is initialized, and a value indicating the state during reassembly is set in the reassembly status variable. Received data is stored in the internal data memory (not shown) of the communication control apparatus, and its start and end addresses are written back to the management data memory 106 via the memory interface 107.

Since the first cell of the frame has been received, the CRC circuit 104 is set with a prescribed value (data of all bits="1"), and performs a CRC calculation for data of the currently received cell.

Note that a considerable amount of time is required until the VPI and VCI are supplied to the memory interface 107 and the reassembly status variable is confirmed, and a CRC calculation cannot be started before then. For this reason, the received data is temporarily stored in the data holding circuit 103. Upon completion of reception of the cell, the intermediate value of the CRC calculation is written back to the management data memory 106 via the memory interface 107.

When this VC receives the subsequent incoming ATM cell, since the reassembly status variable indicates the state during reassembly, the payload of this ATM cell is added to the end of the frame indicated by the end address, and the end address and the frame length are updated. The CRC calculation is performed for the currently received data using the value read out from the management data memory 106 as an initial value, and the calculation result is written back to the management data memory 106 upon completion of reception.

If the received ATM cell is normal and indicates the end of the frame, the calculation result is checked by the checking circuit 105 when the CRC calculation up to data at the end of the cell is completed, and if the calculation result is in agreement with V(x) above, the absence of errors is determined, thus ending the reassembly processing of the frame. Then, the entire frame is transferred to a higher layer.

Note that information indicating the end of the frame used in the AAL layer is stored in a portion of the ATM header, but a detailed description of its detailed structure will be omitted for the sake of simplicity.

As the state-of-the-art technique associated with the CRC calculation, the following inventions are known. That is, in the invention of a CRC code confirmation method and apparatus described in Japanese Patent Laid-Open No. 7-15354, a partial CRC code is generated using a predetermined initial setting value in units of subblocks received by a transmission apparatus that transmits a data block while dividing it into subblocks, a CRC code for the entire data block is reassembled using partial CRC codes, and the reassembled CRC code is confirmed. In the invention of a cell synchronization circuit described in Japanese Patent Laid-Open No. 3-98346, XOR (exclusive OR) circuit networks that perform partial CRC calculations are cascade-connected via latch circuits to realize a CRC calculation in a pipeline manner. In the invention of a CRC arithmetic method described in Japanese Patent Laid-Open No. 3-85923, ROM tables that store CRC calculation results in units of divided data sequences are arranged in correspondence with data sequences obtained by dividing an input data sequence, and the outputs from the ROM tables are XORed to calculate a CRC calculation result for the input data sequence. Furthermore, in the invention described in Japanese Patent Laid-Open No. 6-53942, CRC codes in units of cells are calculated and are sent via special-purpose control wires to check CRC codes in units of cells.

As described above, the AAL layer must perform retrieval of the management table address using the VPI and VCI, and reading and updating of the table contents every time an ATM cell is received. In particular, the CRC calculation cannot be started for the currently received cell data until the CRC intermediate value is read out from the management table in the management data memory and is set in the CRC circuit, resulting in the following drawbacks.

(1) A large number of data holding circuits 103 (registers) for temporarily holding received data are required. For example, when data is input as an 8-bit parallel signal, and loading of management data is delayed by five clocks, data for 40 bits must be stored.

(2) Since the timing of the CRC calculation is delayed, the CRC calculation cannot be completed at the same timing as the end of reception of cells. Normally, the calculation continues after reception of the subsequent cell is started.

(3) Since the end timing of the CRC calculation is delayed, the write operation to the management data memory is delayed accordingly, and the determination timing of the end of frame reassembly is also delayed.

(4) When ATM cells that belong to an identical VC are successively received, management data for the subsequent cell must be immediately loaded. Meanwhile, since the write operation of management data for the previous cell is delayed, the updating and look-up operations of management data replace each other, thus disturbing proper accesses.

SUMMARY OF THE INVENTION

The present invention has been made in consideration of the above situation, and has as its object to provide a communication control apparatus which can start a CRC calculation substantially simultaneously with the start of reception of cell data, can end the CRC calculation simultaneously with the end of reception, and can easily perform read and write control of management data.

According to the present invention, there is provided a communication control apparatus which performs an ATM (asynchronous transfer mode) communication by segmenting a variable-length frame, which is appended with an error check code using CRC (cyclic redundancy check) at the end thereof, into fixed-length cells, performs a CRC calculation each time the apparatus receives a cell, and checks received data for an error when the apparatus receives a cell corresponding to the end of the frame, comprising first calculation means for calculating a first CRC value for communication data of a received cell which has a predetermined constant as an initial value, holding means for holding a CRC value of previously received cells, second calculation means for receiving the CRC value held in the holding means or the predetermined constant, and calculating a correction value as a second CRC value when it is assumed that data of the predetermined constant for one cell long is received, third calculation means for receiving calculation results of the first and second calculation means, and calculating a third CRC value, updating means for causing the holding means to hold the third CRC value calculated by the third calculation means as a CRC value of all cells up to the currently received cell, and checking means for, when the currently received cell corresponds to the end of the frame, checking received data for an error in accordance with the third CRC value calculated by the third calculation means.

According to the present invention, since the CRC value up to the currently received cell, which is corrected and calculated by the correction value is obtained substantially simultaneously with the end of reception of cells, the CRC value can be immediately updated.

Since the past CRC intermediate value is not required, even a delay in reading of management data until the timing at which a CRC correction value is required does not disturb a calculation of the final CRC value. Therefore, reading of management data need not be performed quickly. Hence, since the management data is read out after the management table is updated, data consistency can be maintained, and the management data need not be switched, resulting in easy control.

In this arrangement, the first calculation means may use an initial value "0", and the second calculation means may calculate a correction value with respect to "0" data for one cell long using the CRC value held in the holding means as the initial value when the currently received frame is not the first cell of the frame, and using a value, all bits of which are "1", as the initial value when the currently received frame is the first cell of the frame.

According to the present invention, there is also provided a communication control apparatus which performs an ATM (asynchronous transfer mode) communication by segmenting a variable-length frame, which is appended with an error check code using CRC (cyclic redundancy check) at the end thereof, into fixed-length cells, performs a CRC calculation each time the apparatus receives a cell, and checks received data for an error when the apparatus receives a cell corresponding to the end of the frame, comprising a cell reception unit for receiving a cell supplied from an external circuit, and extracting a virtual path identifier and a virtual channel identifier from the received cell, a management data memory for holding management data, which includes a reassembly status variable that indicates a state of frame reassembly, and a CRC value of cells received and calculated so far, and is used for managing reception reassembly processing of cells in the ATM communication, a CRC circuit for receiving communication data for one cell in the cell received by the cell reception unit, and calculating a CRC value of the communication data using "0" as an initial value, a CRC correction circuit for calculating a correction value by performing a CRC calculation of an initial value while assuming that "0" data for one cell long is received, using the CRC value held in the management data memory as the initial value when the reassembly status variable read out from the management memory in accordance with the identifiers extracted by the cell reception unit indicates a state during reassembly of the frame, or using a value, all bits of which are "1", as the initial value when the reassembly status variable does not indicate the state during reassembly of the frame, an XOR gate for calculating a CRC value up to the currently received cell by XORing the CRC value calculated by the CRC circuit and the correction value calculated by the CRC correction circuit, a checking circuit for, when the currently received cell corresponds to the end of the frame, checking received data for an error in accordance with the CRC value calculated by the XOR gate, and a memory interface circuit for reading out management data of the received cell from the management data memory upon receiving the virtual path identifier and the virtual channel identifier extracted by the cell reception unit, supplying the reassembly status variable and the CRC value of cells received so far in the readout management data to the CRC correction circuit, and writing back the CRC value calculated by the XOR gate to the management data memory to update the management data of the corresponding cell held in the management data memory.

In this arrangement, the apparatus may further comprise a frame reassembly unit for performing reassembly processing of the frame upon receiving the communication data of the received cell, the cell reception unit and the CRC circuit may operate in synchronism with a first clock signal, the CRC correction circuit, the XOR gate, and the frame reassembly unit may operate in synchronism with a second clock signal, the cell reception unit may output the communication data of the received cell as m-bit parallel data, and the apparatus may also comprise a first buffer interface circuit, arranged between the cell reception unit and the frame reassembly unit, and adapted to receive and hold the m-bit parallel communication data output from the cell reception unit, and to supply n (n>m)-bit parallel communication data to the frame reassembly unit, a second buffer interface circuit, arranged between the CRC circuit and the XOR gate, and adapted to receive and hold the CRC value calculated by the CRC circuit, and to supply the held CRC value to the XOR gate in synchronism with the first buffer interface circuit, and a third buffer interface circuit, arranged between the CRC correction circuit and the XOR gate, and adapted to receive and hold the correction value calculated by the CRC correction circuit, and to supply the held correction value to the XOR gate in synchronism with the first and second buffer interface circuits.

According to the present invention, even when the cell reception unit operates using clocks different from those for the frame reassembly unit and the memory interface, a CRC calculation for cell data can be realized by a small-scale circuit.

Also, the second calculation means or the CRC correction circuit may comprise calculation means for calculating a correction value with respect to "0" data for $1/n$ long ($n \geq 2$) of the communication data of the received cell, selection means for selecting one of a calculation result of the calculation means, a CRC value read out from a management data memory, and data, all bits of which are "1", and holding means for holding contents selected by the selection means, and supplying the held contents as an input of the calculation means, and the calculation means may calculate a correction value corresponding to the communication data for one cell by repeating a calculation using the contents supplied from the holding means as an input n times.

DETAILED DESCRIPTION OF THE PREFERRED EMBODIMENTS

Figure 1:
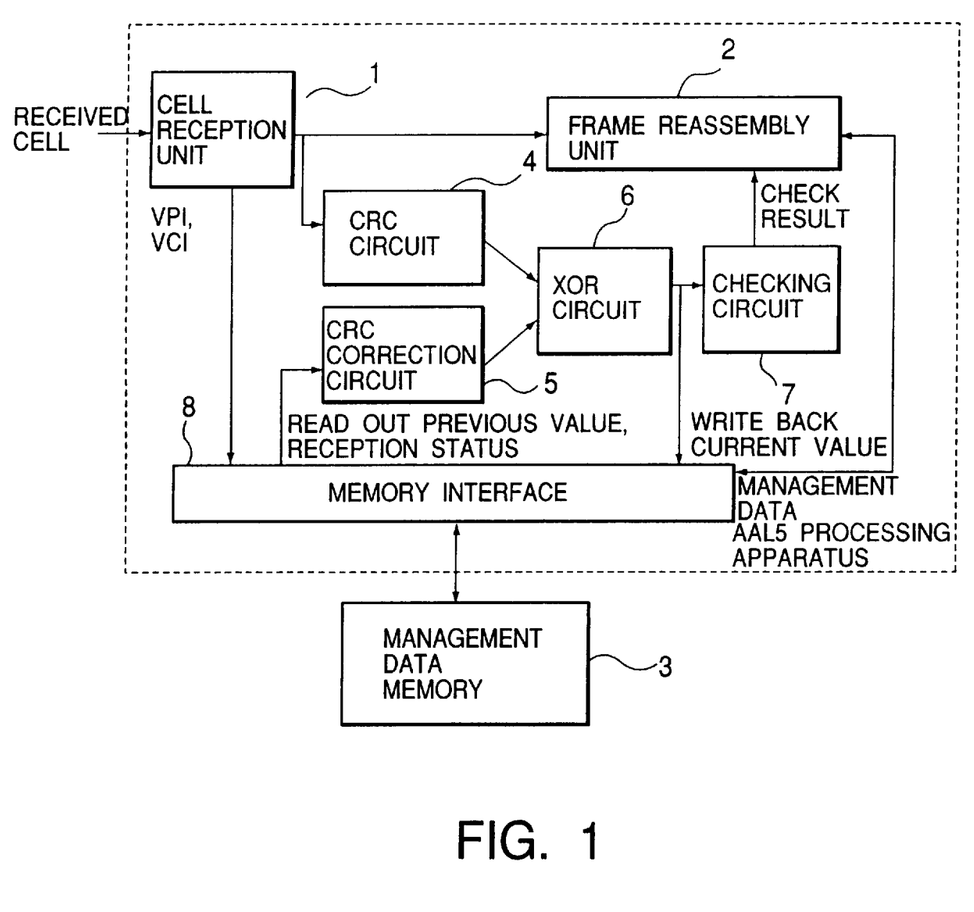
FIG. 1 is a block diagram showing the arrangement of a communication control apparatus according to an embodiment of the present invention.

FIG. 1 is a block diagram showing the arrangement of a communication control apparatus according to an embodiment of the present invention.

Referring to FIG. 1, a communication control apparatus performs ATM (Asynchronous Transfer Mode) communications by segmenting a variable-length frame which has an error check code in CRC (Cyclic Redundancy Check) at its end into fixed-length cells, performs a CRC calculation every time a cell is received, and checks the received data for any errors upon reception of a cell corresponding to the end of the frame. The apparatus comprises a cell reception unit 1 for receiving a cell supplied from an external circuit, and extracting a virtual path identifier (VPI) and a virtual channel identifier (VCI) from the received cell, a frame reassembly unit 2 for performing reassembly processing of a frame using communication data of cells received by the cell reception unit 1, a management data memory 3 for holding management data which includes a reassembly status variable indicating the frame reassembly state and the CRC value of cells received and calculated so far, and manages reception reassembly processing of cells in ATM communications, a CRC circuit 4 for receiving communication data for one cell of the cells received by the cell reception unit 1, and calculating the CRC value of the communication data having "0" as an initial value, a CRC correction circuit 5 for, when the reassembly status variable read out from the management data memory 3 in accordance with the identifiers extracted by the cell reception unit 1 indicates a state during reassembly of the frame, using the CRC value held in the management data memory 3 and calculating a correction value for correcting the initial value while assuming that 1-cell long "0" data is received, and for, when the reassembly status variable does not indicate the state during reassembly of the frame, using "1" as an initial value and calculating a correction value for correcting the initial value while assuming that 1-cell long "0" data is received, an exclusive OR (XOR) circuit 6 for calculating the CRC value up to the currently received cell by XORing the CRC value calculated by the CRC circuit 4 and the correction value calculated by the CRC calculation circuit, a checking circuit 7 for, when the currently received cell corresponds to the end of the frame, checking the received data for any errors in accordance with the CRC value calculated by the XOR circuit 6, and a memory interface 8 for receiving the VPI and VCI extracted by the cell reception unit 1, reading out management data of the received cell from the management data memory 3, supplying the reassembly status variable and the CRC value up to cells received so far from the readout management data to the CRC correction circuit 5, receiving the CRC value calculated by the XOR circuit 6, and updating the management data of the corresponding cell held in the management data memory 3 by writing back the received CRC value.

The cell reception unit 1 extracts the VPI and VCI fields from the received cell, and supplies them to the memory interface 8. Also, the cell reception unit 1 supplies the payload portion of the received cell to the CRC circuit 4. Furthermore, the cell reception unit 1 supplies information indicating the ends of the payload portion and the frame, and error information to the frame reassembly unit 2.

The frame reassembly unit 2 writes payload data supplied from the cell reception unit 1 in a buffer memory (not shown) to update the management table in the management data memory 3. More specifically, when the received cell does not correspond to the end of the frame, the unit 2 sets a value indicating "during reassembly" in a reassembly status variable; when the received cell corresponds to the end of the frame, it sets a value indicating "before start" in the variable. Note that the initial value of the reassembly status variable when the apparatus of this embodiment starts its operation is "before start". Also, the unit 2 updates the frame length and the start and end addresses of the frame to be appropriate values. The updating data are written back to the management data memory 3 via the memory interface 8. At this time, a CRC intermediate value output from the XOR circuit 6 is also written back to the management table in the management data memory 3 at the same time.

The CRC circuit 4 performs a CRC calculation for the 48-byte payload data of the received data.

The CRC calculation of an AAL5 frame will be explained below.

In AAL5, communication data is transmitted while being divided in units of 48-byte cells. Let $I_n(x)$ be the information polynomial of a cell, and $p=48\times 8$ (bits). Then, an information polynomial $I(x)$ of one frame can be expressed by:

$$I(x) = I_0(x) + I_1(x)x^p + I_2(x)x^{2p} + \ldots + I_n(x)x^{np} \quad (7)$$

Assuming a frame consisting of only two cells, we have:

$$\begin{aligned} I(x)x^m &= (I_0(x) + I_1(x)\, x^p)x^m \quad (8) \\ &= (I_0(x)x^m + I_1(x)x^m x^p) \\ &= (Q_0(x)G(x) + R_0(x)) + \\ & \quad (Q_1(x)G(x) + R_1(x))x^p \\ &= (Q_0(x)G(x) + Q_1(x)G(x)x^p) + \\ & \quad (R_0(x) + R_1(x)x^p) \end{aligned}$$

In this case, upon further dividing $R_1(x)x^p$ by $G(x)$, let $Q'_1(x)$ be the quotient, $R'_1(x)$ be the remainder and $$R_1(x)x^p = Q'_1(x)G(x) + R'_1(x)$$

Then, $I(x)$ is written as:

$$\begin{aligned} I(x)x^m &= (Q_0(x)G(x) + Q_1(x)G(x)x^p + Q'_1(x) \quad (9) \\ & \quad G(x)) + (R_0(x) + R'_1(x)) \\ &= (Q_0(x) + Q_1(x)x^p + Q'_1(x))G(x) + \\ & \quad (R_0(x) + R'_1(x)) \end{aligned}$$

On the other hand, since $$I(x)x^m = Q(x)G(x) + R(x) \quad (10)$$

then the following equation holds:

$$R(x) = R_0(x) + R'_1(x) \quad (11)$$

More specifically, when the remainder R'(x) obtained by multiplying the remainder of cells received so far with $x^p$ and dividing the product by G(x) is added to $R_0(x)$ of the currently received cell (XORing them), R(x) for all the pieces of information can be obtained.

Note that multiplying with $x^p$ is equivalent to the fact that p "0"s are input.

The CRC calculation upon multiplying with $x^p$ will be explained below.

Figure 2:
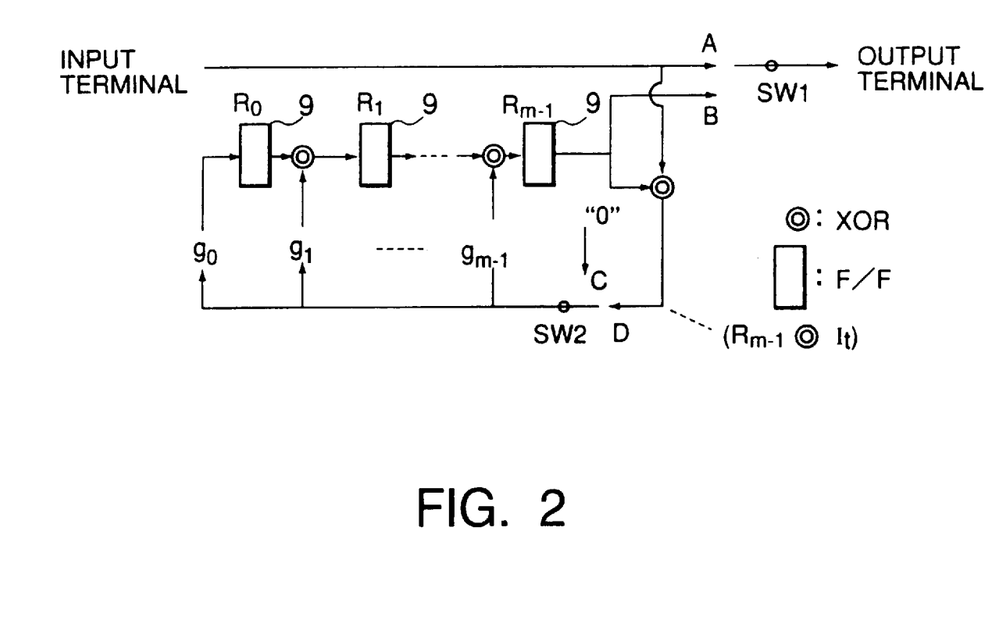
FIG. 2 is a circuit diagram showing the arrangement of a CRC arithmetic circuit in the apparatus shown in FIG. 1.

As shown in FIG. 2, the CRC circuit comprises a circuit adopting an LFSR (Linear Feedback Shift Register), and all the bits are normally set to be "1" as an initial value upon calculating CRC32, but all the bits are set to be "0" in the present invention.

Referring to FIG. 2, the calculation is performed while setting a switch SW1 at the A side and a switch SW2 at the D side. From the input terminal, information is input in the order of $I_{k-1}, I_{k-2}, \ldots I_0$. During this interval, the output terminal directly outputs information $I_{k-1}, I_{k-2}, \ldots, I_0$. At this time, the remainder R(x) obtained upon dividing $I(x)x^m$ by G(x) remains in each F/F 9. Then, by setting the switch SW1 at the B side and the switch SW2 at the C side, remainders $r_{m-1}, r_{m-2}, \ldots, r_0$ need only be output from the output terminal.

Note that calculations performed for $R_q$ ($0 \leq q \leq n-1$) are sequentially observed.

When information $I_t$ is input, values input to $R_q$ and $R_{q-1}$ are:

$$R_0' = (g_0 * (R_{m-1} \odot I_t)) \quad (12)$$

$$R_{q-1}' = R_{q-2} \odot (g_{q-1} * (R_{m-1} \odot I_t)) \quad (13)$$

$$R_q' = R_{q-1} \odot (g_q * (R_{m-1} \odot I_t)) \quad (14)$$

$$R_{m-1}' = R_{m-2} \odot (g_{m-1} * (R_{m-1} \odot I_t)) \quad (15)$$

assuming the marks $\odot$ in FIG. 2 indicate XOR circuits and the asterisk marks in FIG. 2 indicate AND gates.

A value $R_q'$ to be input to $R_q$ when the next information $I_{t-1}$ is input is:

$$R_0'' = (g_0 * (R_{m-1}' \odot I_{t-1})) \quad (16)$$

$$R_q'' = R_{q-1}' \odot (g_q * (R_{m-1}' \odot I_{t-1})) \quad (17)$$

Substituting equation (15) into equation (16) and developing the latter, we have:

$$R_0''' = (g_0 * ((R_{m-2} \odot (g_{m-} * (R_{m-1} \odot I_t))) \odot I_{t-1})) \quad (18)$$

Substituting equations (13) and (15) into equation (17) and developing the latter, we get:

$$\begin{aligned} R_q''' &= (R_{q-2} \odot (g_{q-1} * (R_{m-1} \odot I_t))) \odot (g_q * (R_{m-1}' \odot I_{t-1})) \quad (19) \\ &= (R_{q-2} \odot (g_{q-1} * (R_{m-1} \odot I_t))) \odot (g_q * ((R_{m-2} \\ &\quad \odot (g_{m-1} * (R_{m-1} \odot I_t))) \odot I_{t-1})) \end{aligned}$$

When the above-mentioned conversion is performed for all the pieces of input information I(x), a CRC calculation can be realized by performing a calculation only once using the initial value of each F/F 9, information I(x), and the generation polynomial G(x).

In particular, when all the terms of I(x) are "0", no XOR with $I_t$ is required, and a CRC calculation can be completed by only one calculation using a calculation formula defined by the initial value of each F/F 9 and the generation polynomial G(x)

In this manner, the CRC calculation of the payload portion of the received data is completed, and the calculation result is output to the XOR circuit 6.

The CRC correction circuit 5 performs two operations on the basis of reception status data supplied from the memory interface 8. When the reassembly status variable indicates a state during reassembly of the frame, the circuit 5 calculates a CRC result for the CRC value supplied from the memory interface 8 while assuming that "0"s are received for 48 bytes as the currently received cell.

On the other hand, when the reassembly status variable does not indicate the state during reassembly of the frame, i.e., for the first cell in the frame, processing must be performed while setting "1" in all the bits as the initial value of the LFSR. Therefore, the circuit 5 uses "0xFFFFFFFF" (hexadecimal notation) in place of the CRC value read out by the memory interface 8, and obtains a CRC calculation result using this value while assuming that "0"s are received for 48 bytes as the currently received cell. The output from the CRC correction circuit 5 is supplied to the XOR circuit 6.

Figure 3:
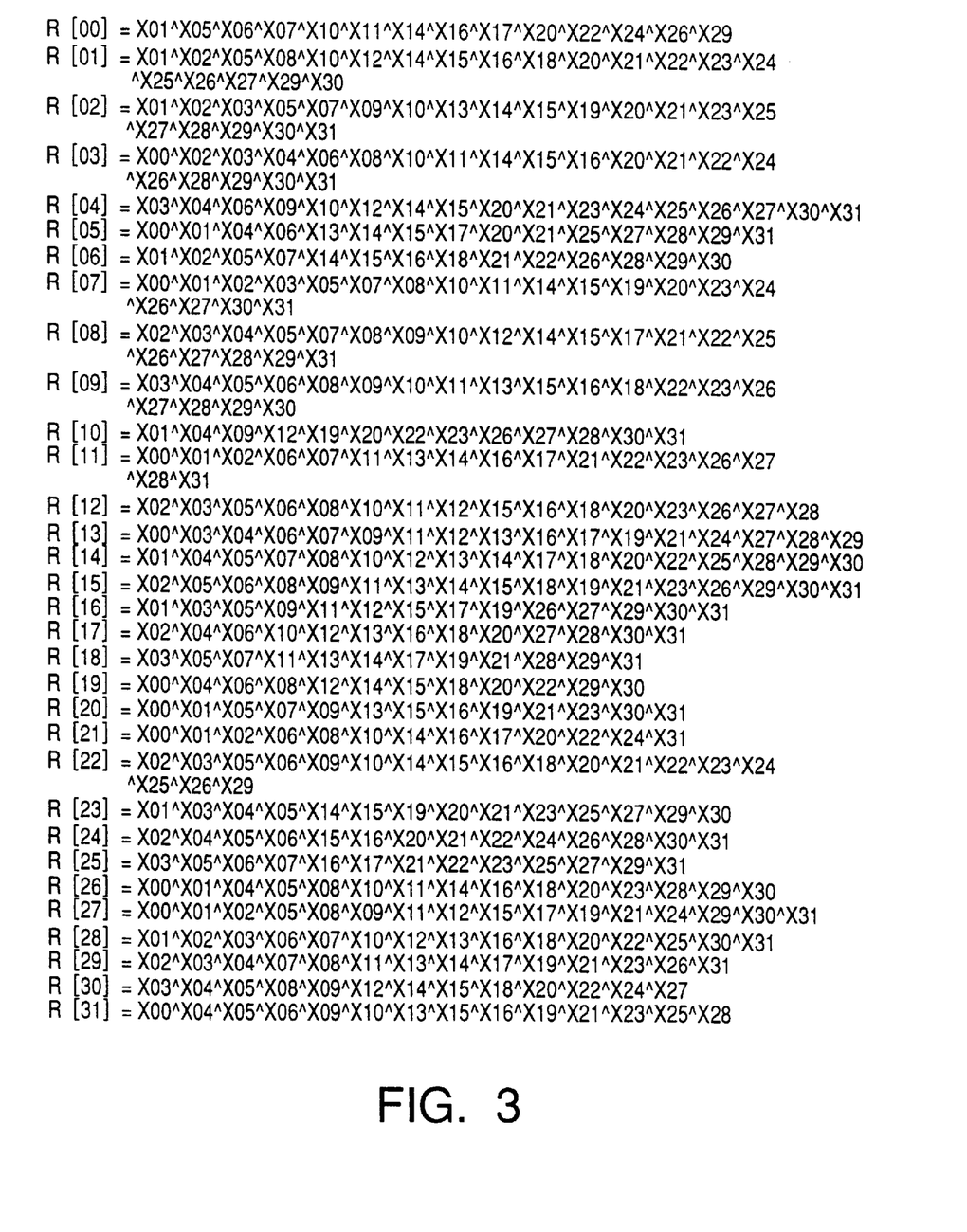
FIG. 3 is a view showing the calculation equations used in a CRC correction circuit in the apparatus shown in FIG. 1.

The calculation used in the CRC correction circuit 5 is performed using the method described in the paragraphs of the CRC calculation upon multiplying with $x^p$, and can be done using calculation equations shown in FIG. 3. In FIG. 3, a value before correction is expressed by 32 bits from X00 to X31, a value after correction is expressed by bits from R[00] to R[31], and "^" represents an XOR calculation.

The XOR circuit 6 XORs the outputs from the CRC circuit 4 and the CRC correction circuit 5 in units of bits, and outputs the calculation result to the checking circuit 7 and the memory interface 8.

The checking circuit 7 compares the output from the XOR circuit 6 and V(x) above, and informs the frame reassembly unit 2 of the absence of errors as a checking result when the two values coincide with each other.

Upon receiving the VPI and VCI from the cell reception unit 1, the memory interface 8 calculates the storage address of the corresponding management data on the basis of the VPI and VCI values, and reads out the management data from the management data memory 3. The memory interface 8 extracts the reassembly status variable and the CRC value for cells received previously from the readout management data, and supplies them to the CRC correction circuit 5. Also, the memory interface 8 writes back the CRC intermediate value output from the XOR circuit 6 to the management table in the management data memory 3, exchanges management data with the frame reassembly unit 2, and writes back the management data to the management table in the management data memory 3.

Figure 4:
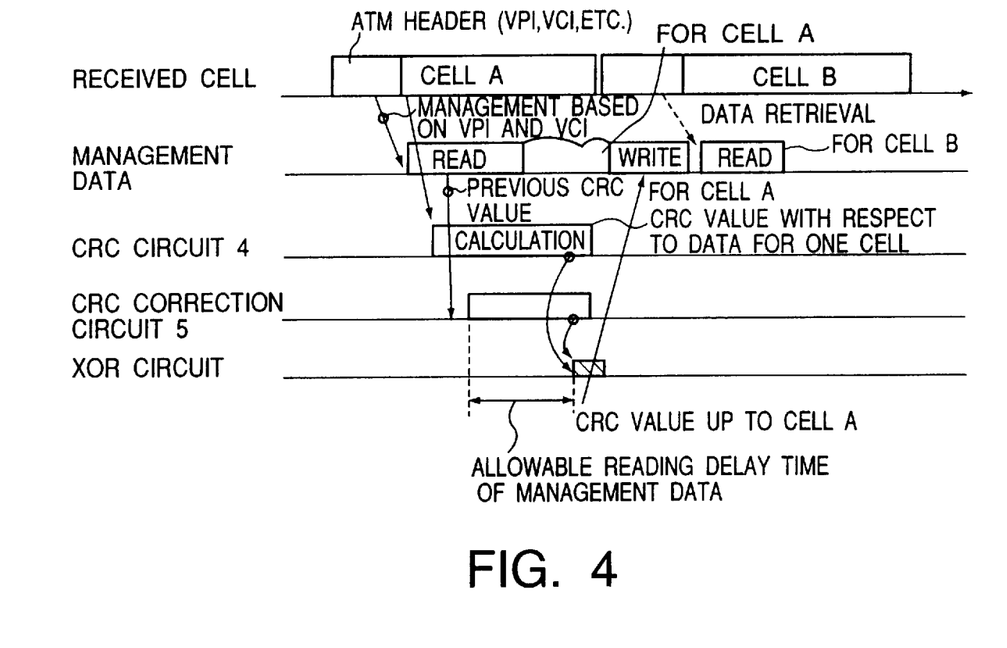
FIG. 4 is a timing chart showing the operation timing of the apparatus shown in FIG. 1.

The operation of the above-mentioned arrangement will be explained below with reference to the operation timing chart shown in FIG. 4.

Upon receiving cell A, the cell reception unit 1 extracts the VPI and VCI, and the memory interface 8 reads out corresponding management data. Of the readout management data, the CRC intermediate value (previous value) is sent to the CRC correction circuit 5 and is used in a calculation.

On the other hand, the payload portion of cell A is immediately input to the CRC circuit 4, and is subjected to a CRC calculation. Upon completion of reception of cell A, the XOR circuit 6 calculates the CRC value from the first cell to cell A in the frame, and the calculation result is written back to the management table. Since the CRC calculation is completed substantially simultaneously with the end of reception, the management data can be written immediately. Since the reading operation of the CRC intermediate value is not seriously limited in terms of time, management data for the subsequent cell is read out after the management data is written.

According to this embodiment, since the XOR circuit 6 can output the calculation result substantially simultaneously with the end of reception of a cell, data can be immediately written back to the management table. Since the operation of the CRC circuit 4 does not require any previous CRC intermediate value, even a delay in reading of the management data until the time at which the XOR circuit 6 requires a CRC correction value does not disturb the calculation of the final CRC value.

Therefore, the management data need not be read out urgently. For example, management data for cell B may be read out after the data for cell A is written in the management table.

This fact is a great advantage for a case wherein cells A and B belong to an identical virtual channel. In the prior art, since reading of data for cell B is performed prior to writing of data for cell A, management data for cell B must be switched to that for cell A that has been transferred to the memory interface 8. However, in this embodiment, since data for cell B is read out after the management table is updated, data consistency is maintained, and no switching is required, resulting in easy control.

Figure 5:
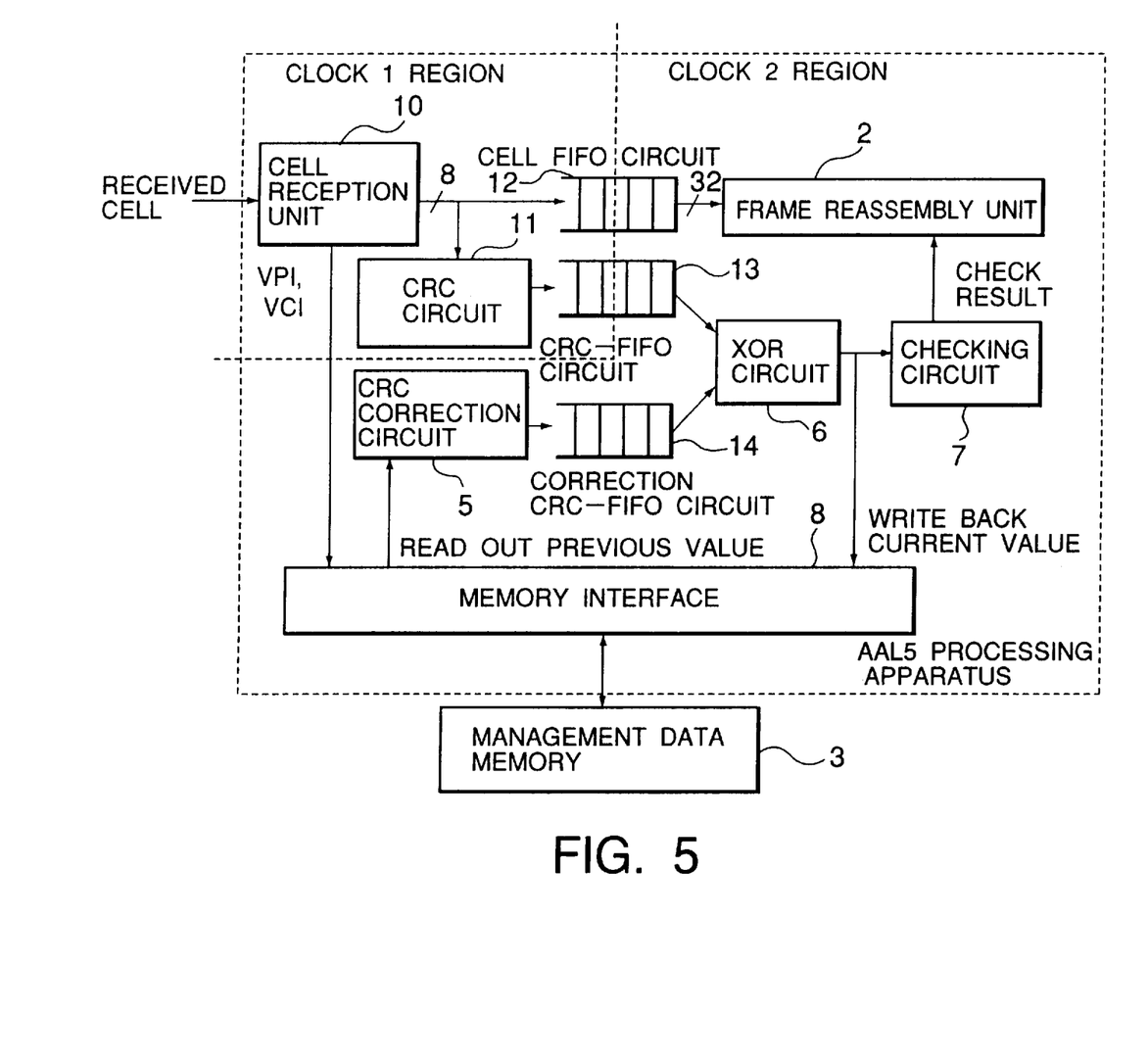
FIG. 5 is a block diagram showing the arrangement of a communication control apparatus according to another embodiment of the present invention.

FIG. 5 is a block diagram showing the arrangement of a communication control apparatus according to another embodiment of the present invention.

The characteristic features of the embodiment shown in FIG. 5 with respect to the arrangement shown in FIG. 1 are as follows. That is, a cell reception unit 10 for outputting a received cell as 8-bit parallel data and a CRC circuit 11 for performing a CRC calculation of the payload portion for one cell of the received cell supplied from the cell reception unit 10 operate in synchronism with a first clock signal (clock 1 region), and a frame reassembly unit 2, a CRC correction circuit 5, an XOR circuit 6, a checking circuit 7, and a memory interface 8 operate in synchronism with a second clock signal (clock 2 region) Also, the apparatus shown in FIG. 5 further comprises a cell FIFO (First In First Out) circuit 12 serving as a first buffer interface circuit, which is arranged between the cell reception unit 10 and the frame reassembly unit 2, receives and holds 8-bit parallel communication data output from the cell reception unit 10, supplies 32-bit parallel communication data to the frame reassembly unit 2, and buffers communication data between the cell reception unit 10 and the frame reassembly unit 2, a CRC-FIFO circuit 13 serving as a second buffer interface circuit, which is arranged between the CRC circuit 11 and the XOR circuit 6, receives and holds a CRC value calculated by the CRC circuit 11, supplies the held CRC value to the XOR circuit 6 in synchronism with the cell FIFO circuit 12, and buffers the CRC value between the CRC circuit 11 and the XOR circuit 6, and a correction CRC-FIFO circuit 14 serving as a third buffer interface circuit, which is arranged between the CRC correction circuit 5 and the XOR circuit 6, receives and holds a correction value calculated by the CRC correction circuit 5, supplies the held correction value to the XOR circuit 6 in synchronism with the cell FIFO circuit 12 and the CRC-FIFO circuit 13, and buffers the correction value between the CRC correction circuit 5 and the XOR circuit 6. Since other arrangements are the same as those shown in FIG. 1, and the same reference numerals in FIG. 5 denote the same parts as in FIG. 1, a detailed description thereof will be omitted.

The ATM forum as a group of ATM related vendors summarized the interface standard between the physical layer and the ATM layer as UTOPIA (Universal Test & Operations PHYInterface of ATM). This standard is roughly classified into two specifications depending on the communication rates:

up to 155 Mbps
  data bus: 8 bits, clock: 25 MHz (maximum)
up to 622 Mbps
  data bus: 16 bits, clock: 40 MHz (maximum)

On the other hand, since frame reassembly processing or the like requires quicker processing, the data width to be processed is set to be as wide as 32 bits, and the clock rate is often increased beyond 33 MHz. Since data transfer with the physical layer permits handshaking in units of words, data are not always input at a constant rate but are preferably input at a constant rate to perform, e.g., frame reassembly processing.

In consideration of the above situation, as shown in FIG. 5, the cell FIFO circuit 12 in units of cells is inserted between the cell reception unit 10 and the frame reassembly unit 2 to absorb differences in data width, clock, and data transfer rate.

When a CRC calculation is performed, the basic circuit performs processing in units of bits, as shown in FIG. 2. However, as described above, a plurality of bits can be processed simultaneously. However,. as the number of bits to be processed parallelly increases, the XOR circuit becomes more complicated. For this reason, the number of bits to be processed parallelly is preferably small in terms of the circuit scale. More specifically, since the cell FIFO circuit 12 outputs 32-bit data and receives 8-bit data, the CRC circuit is preferably arranged at the input side of the cell FIFO circuit 12.

The cell reception unit 10 is a circuit that complies with the UTOPIA specifications, and performs cell data transfer with the physical layer. As in the cell reception unit 1, the cell reception unit 10 extracts the VPI and VCI values from input cell data, and supplies them to the memory interface 8 to read out management data. The cell reception unit 10 inputs cell data to the cell FIFO circuit 12 and the CRC circuit 11.

The CRC circuit 11 performs a CRC calculation for the 48-byte payload portion of a cell, and the initial value of an LFSR is "0". Upon completion of the calculation for one cell, the CRC circuit 11 inputs the calculation result to the CRC-FIFO circuit 13.

The cell FIFO circuit 12 supplies stored data to the frame reassembly unit 2 when it stores data for one or more cells.

The CRC-FIFO circuit 13 holds the CRC value output from the CRC circuit 11, and is assumed to output the CRC value corresponding to the cell output from the cell FIFO circuit 12 to the XOR circuit 6. More specifically, the cell data and the CRC value are synchronously output.

The correction CRC-FIFO circuit 14 holds the calculation result of the CRC correction circuit 5, and is used for outputting the CRC correction value in synchronism with the outputs from the cell FIFO circuit 12 and the CRC-FIFO circuit 13.

In the above-mentioned arrangement, cell data input from the physical layer is subjected to a CRC calculation in the clock 1 region with a small bit width, and the calculation result is stored in the CRC-FIF0 circuit 13. In the clock 2 region, the correction value for one cell is calculated based on the past CRC intermediate value, and is input to the correction CRC-FIFO circuit 14 to be synchronized with the cell data. The frame reassembly unit 2 reads out the cell data from the cell FIFO circuit 12, and at the same time, the XOR circuit 6 XORs the outputs from the CRC-FIFO circuit 13 and the correction CRC-FIF0 circuit 14 to obtain a correct CRC value.

In this embodiment, the following advantages are expected. That is, the CRC circuit 11 can be realized by a relatively small circuit, and can complete its calculation substantially simultaneously with the end of reception of a cell since it starts the calculation without any past CRC intermediate value. For this reason, it is easy to synchronize the cell FIFO circuit 12 and the CRC-FIFO circuit 13. The calculation in the CRC correction circuit 5 need only be completed until the cell data is output at the output side of the cell FIFO circuit 12, and is not seriously limited in terms of time.

Figure 6:
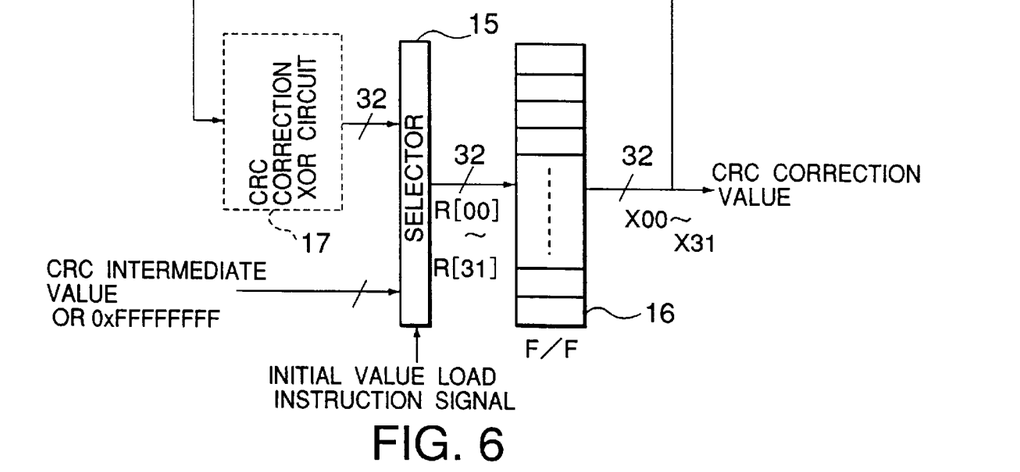
FIG. 6 is a block diagram showing an example of the arrangement of a CRC correction circuit in the apparatus shown in FIG. 5.

FIG. 6 is a partial block diagram showing the arrangement of a communication control apparatus according to still another embodiment of the present invention.

In the two embodiments described above, the CRC correction circuit 5 corrects the CRC intermediate value while assuming that it has received "0"s for 48 bytes, and obtains a result by a single calculation using the calculation equations shown in FIG. 3. However, if the CRC correction circuit 5 has an allowable calculation time for several clocks, the same effect as in the above embodiments can be obtained by using a calculation circuit which assumes that there are "0"s for 48 bytes/n long (n is an integer equal to or larger than 2), and performing a calculation n times. For example, if n=4, a calculation circuit with respect to "0"s for 12 bytes is used, and a calculation is repeated four times.

In the circuit shown in FIG. 6, a value read out from the memory interface 8 is loaded into 32 F/Fs (flip-flops) 16 via a selector 15. The outputs X00 to X31 from the F/Fs 16 are input to a CRC correction XOR circuit 17 with respect to "0"s for 12 bytes, and outputs R[00] to R[31] from the circuit 17 are loaded into the F/Fs 16 via the selector 15.

With this procedure, CRC correction for 12 bytes is completed. When this procedure is repeated a total of four times, a result equivalent to that of CRC correction with respect to "0"s for 48 bytes can be obtained. In this manner, since the number of "0"s decreases, the circuit scale of the CRC correction XOR circuit 17 can be reduced, and hence, that of the CRC correction circuit can be reduced.

What is claimed is:

1. A communication control apparatus which performs an ATM (asynchronous transfer mode) communication by segmenting a variable-length frame, which is appended with an error check code using CRC (cyclic redundancy check) at the end thereof, into fixed-length cells, performs a CRC calculation each time said apparatus receives a cell, and checks received data for an error when said apparatus receives a cell corresponding to the end of the frame, comprising:

first calculation means for calculating a first CRC value for communication data of a cell which is received currently and has a predetermined constant as an initial value, in which the first CRC value is a remainder obtained by dividing a payload of the cell which is received currently by a generation polynomial;

holding means for holding a sum of CRC values of cells which have been received previously;

second calculation means for receiving one of the sum of CRC values held in said holding means or the predetermined constant as an initial value, and calculating a correction value as a second CRC value when it in assumed that data of the predetermined constant for one cell long is received, in which the second CRC value is a remainder obtained by dividing a shifted result by the generation polynomial, where the shifted result is the initial value shifted with a data length of the cell which is received currently;

third calculation means for receiving calculation results of said first and second calculation means and adding the calculation results as a third CRC value;

updating means for causing said holding means to hold the third CRC value calculated by said third calculation means as a CRC value of all cells up to the currently received cell; and checking means for, when the currently received cell corresponds to the end of the frame, checking received data for an error in accordance with the third CRC value calculated by said third calculation means.

2. An apparatus according to claim 1, wherein said first calculation means uses an initial value "0", and said second calculation means calculates a correction value with respect to "0" data for one cell long using the CRC value held in said holding means as the initial value when the currently received frame is not the first cell of the frame, and using a value, all bits of which are "-1""1", as the initial value when the currently received frame is the first cell of the frame.

3. An apparatus according to claim 2, wherein said second calculation means comprises:

calculation means for calculating a correction value with respect to "0" data for 1/n long (n≧2) of the communication data of the received cell;

selection means for selecting one of a calculation result of said calculation means, a CRC value read out from a management data memory, and data, all bits of which are "1"; and holding means for holding contents selected by said selection means, and supplying the held contents as an input of said calculation means, and said calculation means calculates a correction value corresponding to the communication data for one cell by repeating a calculation using the contents supplied from said holding means as an input n times.

4. A communication control apparatus which performs an ATM (asynchronous transfer mode) communication by segmenting a variable-length frame, which is appended with an error check code using CRC (cyclic redundancy check) at the end thereof, into fixed-length cells, performs a CRC calculation each time said apparatus receives a cell, and checks received data for an error when said apparatus receives a cell corresponding to the end of the frame, comprising:

a cell reception unit for receiving a cell supplied from an external circuit, and extracting a virtual path identifier and a virtual channel identifier from the received cell;

a management data memory for holding management data, which includes a reassembly status variable that indicates a state of frame reassembly, and a CRC value of cells received and calculated so far, and is used for managing reception reassembly processing of cells in the ATM communication;

a management data memory for holding management data, which includes a reassembly status variable that indicates a state of frame reassembly, and a CRC value of cells which have been received and calculated previously, and is used for managing reception reassembly processing of cells in the ATM communication;

a CRC circuit for receiving communication data in a cell received currently by said cell reception unit, and calculating a CRC value of the communication data using "0" as an initial value, in which the CRC value is a remainder obtained by dividing the communication data of the currently received cell by a generation polynomial;

a CRC correction circuit for calculating a correction value by performing a CRC calculation of an initial value while assuming that "0" data for one cell long is received, using the CRC value held in said management data memory as the initial value when the reassembly status variable read out from said management memory in accordance with the identifiers extracted by said cell reception unit indicates a state during reassembly of the frame, or using a value, all bits of which are "1", as the initial value when the reassembly status variable does not indicate the state during reassembly of the frame, in which the correction value is a remainder obtained by dividing a shifted result by the generation polynomial, where the shifted result is the initial value shifted with the one cell length of the cell which is received currently and;

an XOR gate for calculating a CRC value up to the currently received cell by XOR calculating the CRC value calculated by said CRC circuit and the correction value calculated by said CRC correction circuit;

a checking circuit for, when the currently received cell corresponds to the end of the frame, checking received data for an error in accordance with the CRC value calculated by said XOR gate; and a memory interface circuit for reading out management data of the received cell from said management data memory upon receiving the virtual path identifier and the virtual channel identifier extracted by said cell reception unit, supplying the reassembly status variable and the CRC value of cells received so far in the readout management data to said CRC correction circuit, and writing back the CRC value calculated by said XOR gate to said management data memory to update the management data of the corresponding cell held in said management data memory.

5. An apparatus according to claim 4, wherein said CRC correction circuit comprises:

calculation means for calculating a correction value with respect to "0" data for 1/n long (n≧2) of the communication data of the received cell;

selection means for selecting one of a calculation result of said calculation means, the CRC value read out from said management data memory, and data, all bits of which are "1"; and holding means for holding contents selected by said selection means, and supplying the held contents as an input of said calculation means, and said calculation means calculates a correction value corresponding to the communication data for one cell by repeating a calculation using the contents supplied from said holding means as an input n times.

6. An apparatus according to claim 3, further comprising a frame reassembly unit for performing reassembly processing of the frame upon receiving the communication data of the received cell, and wherein said cell reception unit and said CRC circuit operate in synchronism with a first clock signal, said CRC correction circuit, said XOR gate, and said frame reassembly unit operate in synchronism with a second clock signal, said cell reception unit outputs the communication data of the received cell as m-bit parallel data, and said apparatus further comprises:

a first buffer interface circuit, arranged between said cell reception unit and said frame reassembly unit, and adapted to receive and hold the m-bit parallel communication data output from said cell reception unit, and to supply n (n>m)-bit parallel communication data to said frame reassembly unit;

a second buffer interface circuit, arranged between said CRC circuit and said XOR gate, and adapted to receive and hold the CRC value calculated by said CRC circuit, and to supply the held CRC value to said XOR gate in synchronism with said first buffer interface circuit; and a third buffer interface circuit, arranged between said CRC correction circuit and said XOR gate, and adapted to receive and hold the correction value calculated by said CRC correction circuit, and to supply the held correction value to said XOR gate in synchronism with said first and second buffer interface circuits.

7. An apparatus according to claim 6, wherein second calculation means or said CRC correction circuit comprises:

calculation means for calculating a correction value with respect to "0" data for 1/n long (n≧2) of the communication data of the received cell;

selection means for selecting one of a calculation result of said calculation means, the CRC value read out from said management data memory, and data, all bits of which are "1"; and holding means for holding contents selected by said selection means, and supplying the held contents as an input of said calculation means, and said calculation means calculates a correction value corresponding to the communication data for one cell by repeating a calculation using the contents supplied from said holding means as an input n times.

* * * * *